United States Patent [19]
Durston et al.

[11] Patent Number: 6,154,373
[45] Date of Patent: Nov. 28, 2000

[54] HIGH DENSITY CROSS-CONNECTION SYSTEM

[75] Inventors: Andrew C. Durston, Lakehurst; Liang Hwang, Old Bridge; Hector F. Rodriguez, Middletown, all of N.J.

[73] Assignee: Lucent Technologies Inc., Murray Hill, N.J.

[21] Appl. No.: 09/275,332

[22] Filed: Mar. 24, 1999

[51] Int. Cl.[7] .................................................. H05K 1/14
[52] U.S. Cl. .......................... 361/788; 361/796; 361/803; 361/686; 439/59; 439/61; 439/62; 174/261
[58] Field of Search .................................. 361/788, 796, 361/733, 803, 679, 686, 777; 439/61, 59, 62, 65, 74; 174/261, 158 R, 32

[56] References Cited

U.S. PATENT DOCUMENTS

| | | |
|---|---|---|
| 4,700,274 | 10/1987 | Laut ........................................ 361/729 |
| 5,091,822 | 2/1992 | Takashima ............................... 361/695 |
| 5,119,273 | 6/1992 | Corda ....................................... 361/788 |
| 5,122,691 | 6/1992 | Balakrishnan ............................ 326/86 |
| 5,130,894 | 7/1992 | Miller ...................................... 361/735 |
| 5,167,511 | 12/1992 | Krajewski et al. ........................ 439/61 |
| 5,289,340 | 2/1994 | Yoshifuji .................................. 361/685 |
| 5,308,926 | 5/1994 | Aurerbuch et al. ..................... 174/250 |
| 5,317,477 | 5/1994 | Gillett ...................................... 361/683 |
| 5,583,867 | 12/1996 | Poole ....................................... 370/257 |
| 5,603,044 | 2/1997 | Annapareddy et al. ................ 395/800 |

*Primary Examiner*—Jeffrey Gaffin
*Assistant Examiner*—David Foster
*Attorney, Agent, or Firm*—David L. Davis

[57] ABSTRACT

Secondary backplane boards are secured to a main backplane board to provide interconnection paths in a direction transverse to interconnection paths provided on the main backplane board, so that current manufacturing capabilities of multi-layer backplane boards are not exceeded.

4 Claims, 5 Drawing Sheets

HIGH DENSITY CROSS-CONNECTION SYSTEM

BACKGROUND OF THE INVENTION

This invention relates to the provision of connections between circuit cards and cables and, more particularly, to such provision through a backplane in a high density application.

Modern electronic systems equipment, such as for telecommunications purposes, is often constructed as modular circuit cards inserted into guide slots of mechanical card cages for engagement with connectors on a first side of a main backplane mounted to the card cage at the inward ends of the guide slots. For telecommunications equipment, the second side of the main backplane is typically provided with connectors to which cables may be attached. The main backplane provides interconnections between the connectors on its first and second sides.

In a particular application, it is required to interconnect sixteen circuit cards to 192 cables, with each circuit card having four individual connections to each cable. This results in a total of 12,288 interconnections which must be made between the connectors for the circuit cards and the connectors for the cables. Modern backplanes are composed of multiple layers, with each layer accommodating a number of circuit paths. Current backplane manufacturing imposes a set of limits on backplane designs including the thickness of the backplane and the resulting layer count. At the present time, most manufacturers can only produce a 400 mil thick backplane which would limit layer count to about sixty-four, with twenty-eight signal layers available for routing. Such a backplane is insufficient for accommodating the 12,288 interconnections required in the particular application.

Accordingly, there exists a need for a high density cross-connection system which can accommodate the desired number of interconnections.

SUMMARY OF THE INVENTION

According to the present invention, groups of related circuit paths which connect to the same physical area of a group of circuit cards are routed on secondary backplane boards connected to the main backplane board. The cables are connected to the secondary backplane boards and the remaining number of circuit paths required to be routed on the main backplane board falls within manufacturing limits.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
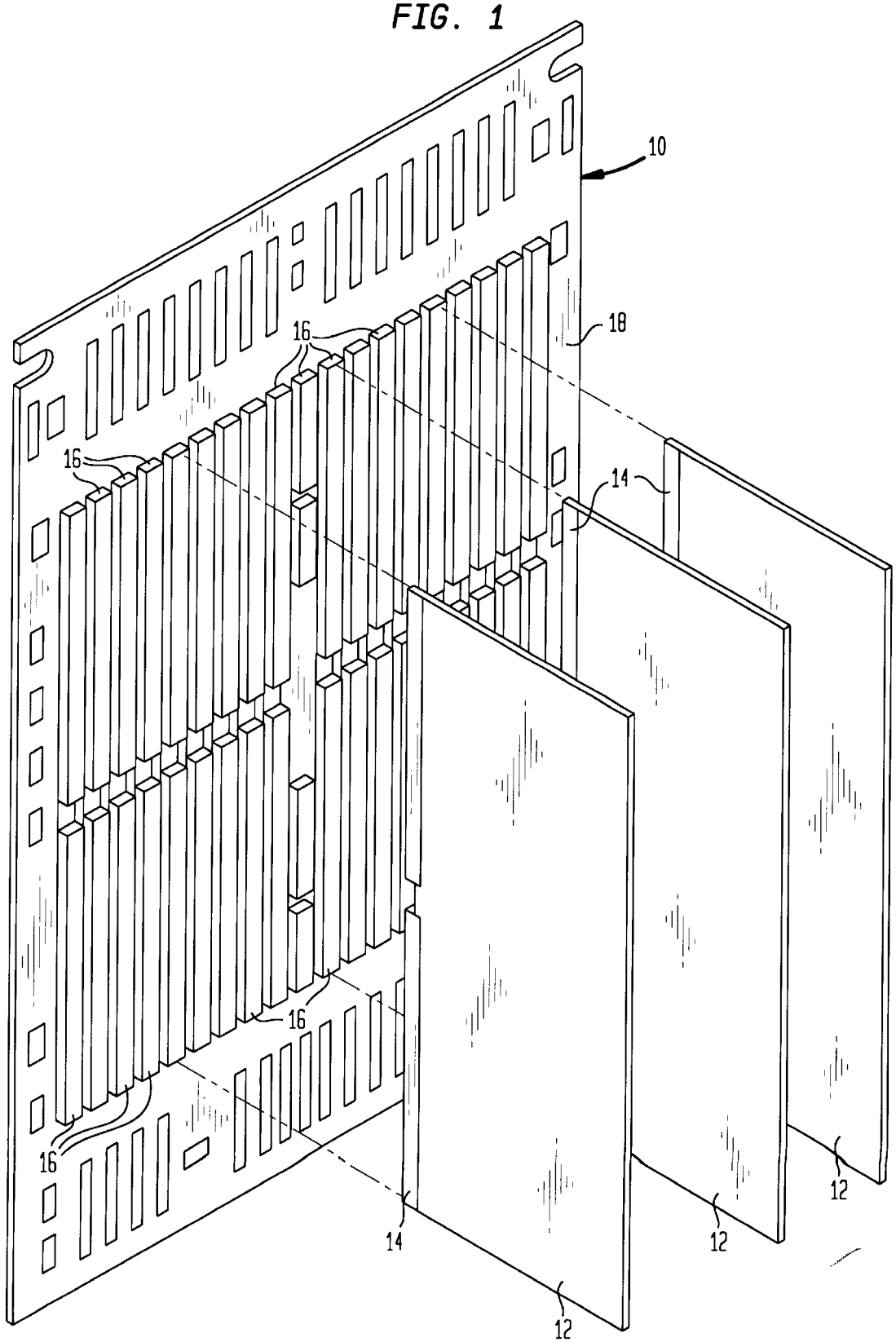
FIG. 1 schematically depicts the first side of a main backplane board according to this invention, showing how a plurality of circuit cards are connected thereto.

FIG. 1 shows a main backplane board 10 and a plurality of circuit cards 12. Each of the circuit cards 12 has a connector array 14 mounted to its leading edge and the main backplane board 10 has an array of card connectors 16 on a first side 18. As is conventional, the connectors 14, 16 comprise pin field arrays. The card connectors 16 are adapted for mating engagement with the connector arrays 14 of the circuit cards 12 to hold the circuit cards 12 in a parallel spaced array. Illustratively, the circuit cards 12 are held in a vertical orientation.

Figure 2:
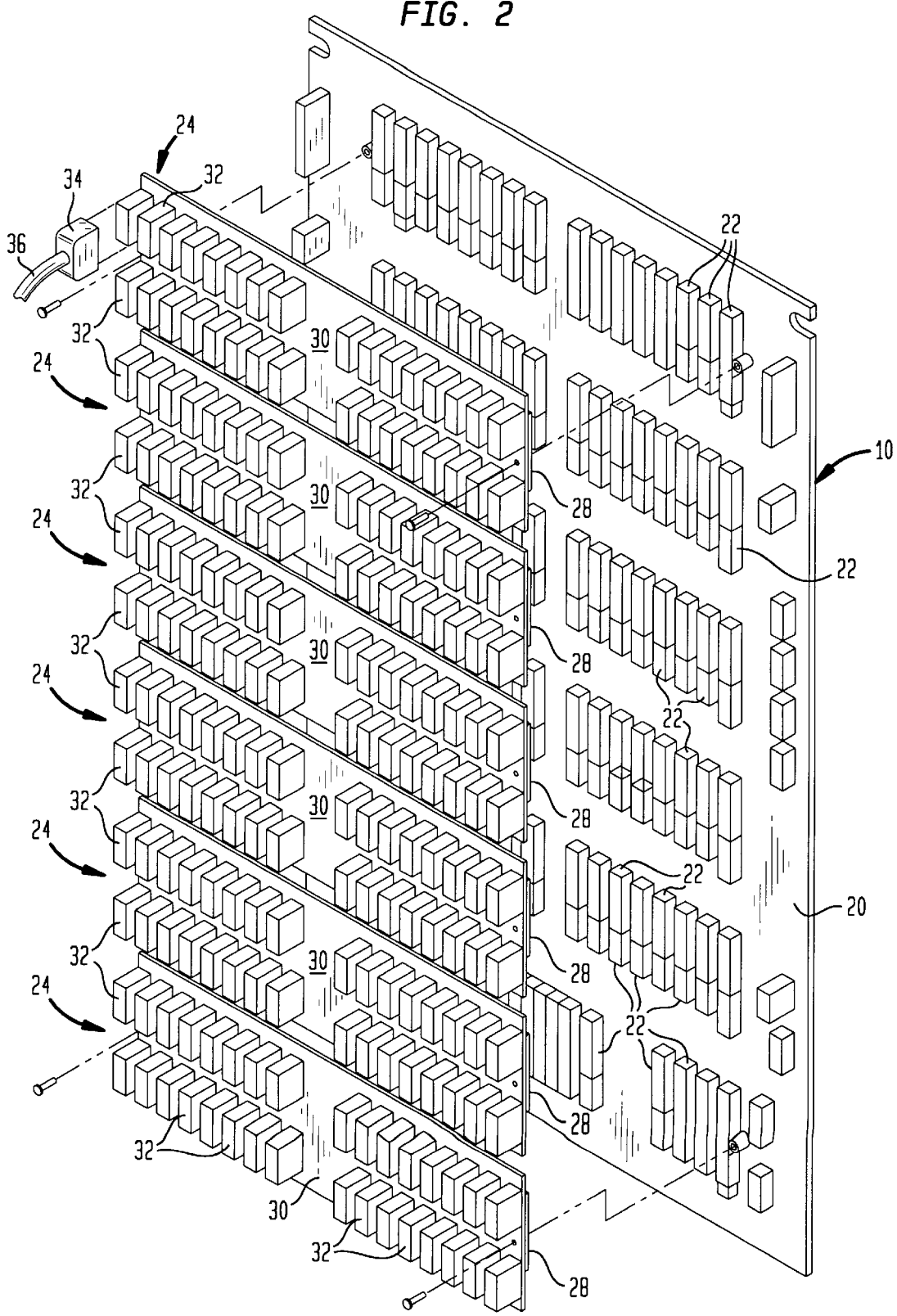
FIG. 2 schematically depicts the second side of the main backplane board shown in FIG. 1 and the connections thereto of a plurality of secondary backplane boards, and showing the connection of a cable to a secondary backplane board.

As shown in FIG. 2, a plurality of secondary connectors 22 are mounted on the second side 20 of the main backplane board 10. The secondary connectors 22 are arranged in a plurality of groups, illustratively six in number, with each group extending horizontally.

According to the present invention, a plurality of secondary backplane boards 24 are provided, illustratively six in number, each corresponding to one of the groups of secondary connectors 22. Each of the secondary backplane boards 24 has a first side 26 (FIG. 3) on which is mounted a plurality of connectors 28 adapted for mating engagement with the respective group of secondary connectors 22. On the second side 30 of each of the secondary backplane boards 24, there is mounted a plurality of connectors 32 each of which is adapted for mating engagement with a connector 34 terminating a respective cable 36.

Figure 3:
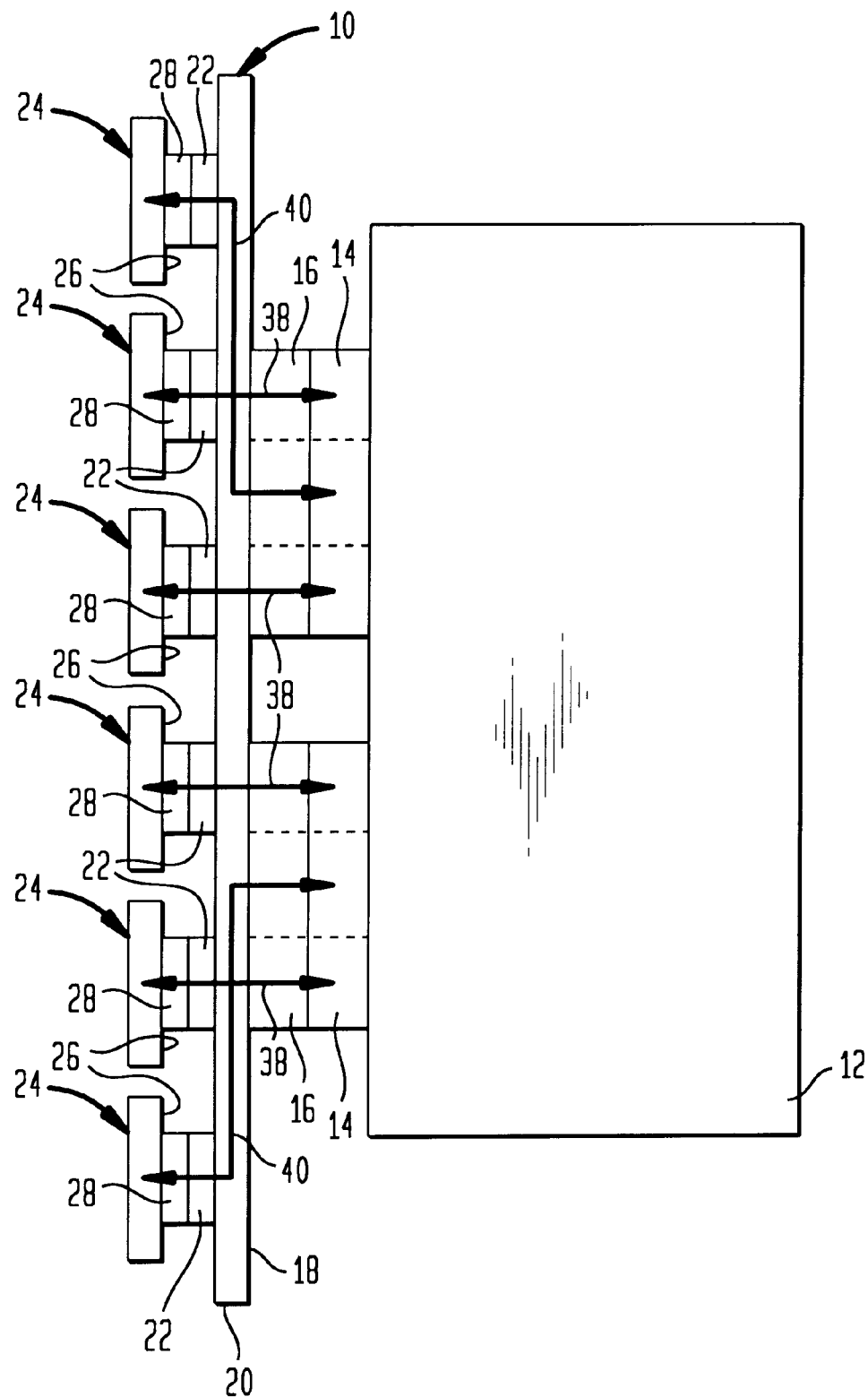
FIG. 3 is a schematic side view illustrating the inventive routing of interconnections from a circuit card to the secondary backplane boards.

FIG. 3 illustrates the inventive routing of connections between the connector arrays 14 on the circuit cards 12 and the secondary backplane boards 24. As shown in FIG. 3, there is insufficient room for all the secondary backplane boards 24 to be directly across the main backplane board 10 from the card-connectors 16. Accordingly, each card connector 16 has three portions, each corresponding to a respective one of the secondary backplane boards 24. The three portions include a central portion and two outer portions flanking the central portion in the vertical direction. The secondary connectors 22 are divided into groups with each secondary connector 22 in a first group being directly across the main backplane board 10 from a first outer portion of a respective card connector 16 and each secondary connector 22 in a second group being directly across the main backplane board 10 from a second outer portion of a respective card connector 16. Each secondary connector 22 in the third group is on the other side of the secondary connector 22 in the second group from the secondairy connector 22 in the first group in the vertical direction.

Figure 4:
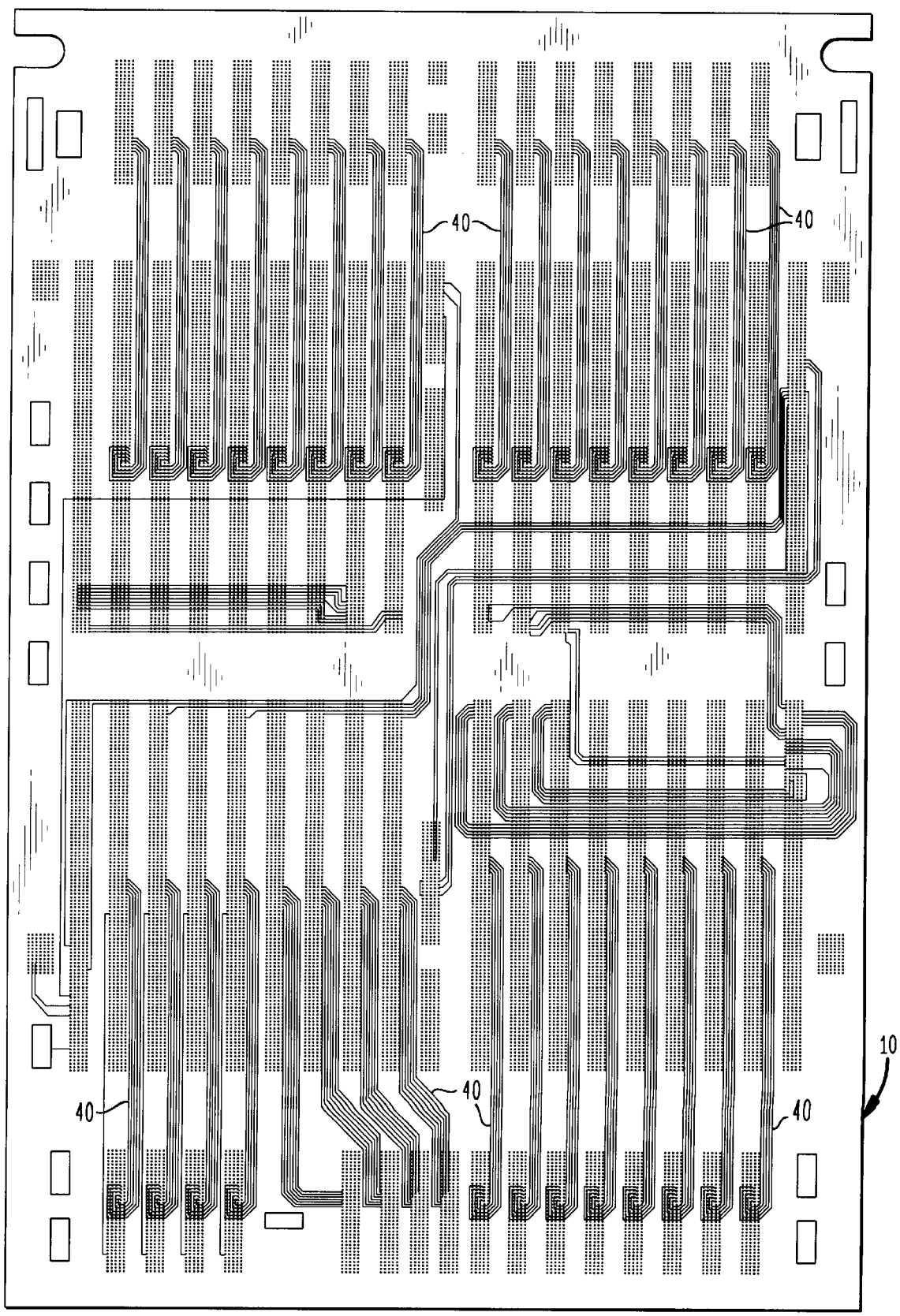
FIG. 4 illustrates cross-connection circuit paths on a typical layer of the main backplane board according to this invention.

The main backplane board 10 therefore includes circuit paths 38 which go straight through the main backplane board 10 to interconnect opposing ones of the card connectors 16 with the respective secondary connectors 22. Further, the main backplane board 10 includes circuit paths 40 which interconnect the central portion of a respective card connector 16 with a respective secondary connector 22 in the third group of secondary connectors. As shown in FIG. 4, the circuit paths 40 are substantially vertically oriented through the main backplane board 10. Since all of the circuit paths 40 are substantially in the same direction, they can all be accommodated within the main backplane board 10.

Figure 5:
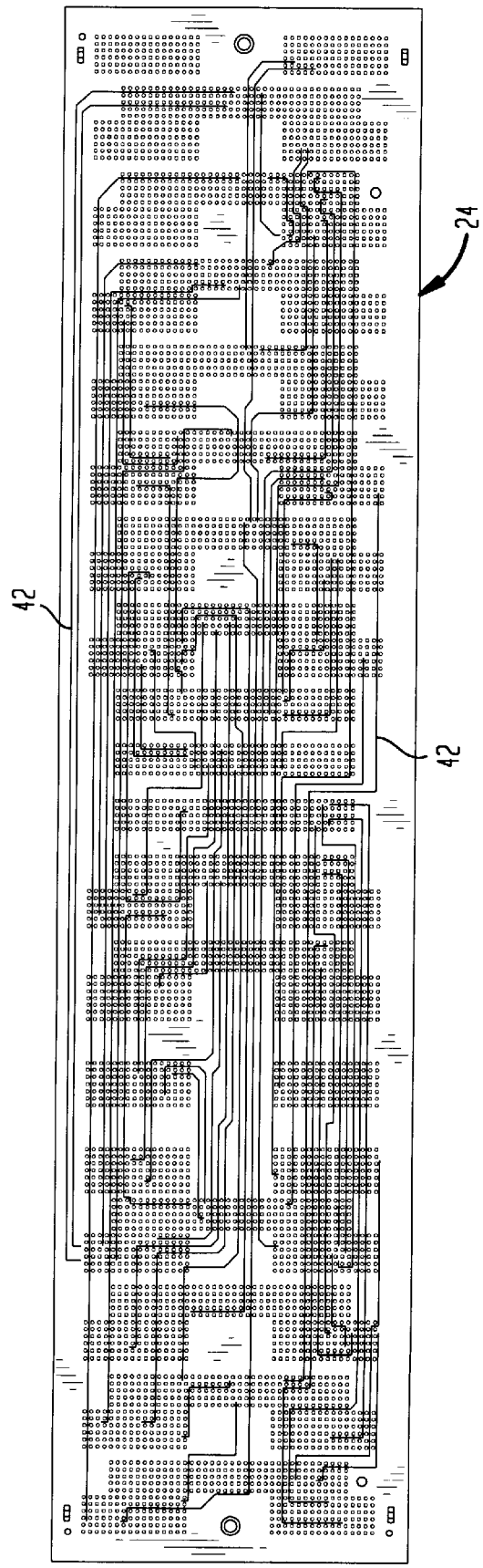
FIG. 5 illustrates cross-connection circuit paths on a typical layer of a secondary backplane board according to this invention.

To provide interconnections in the horizontal direction across the plurality of circuit cards 12, circuit paths 42 (FIG. 5) are provided on the secondary backplane boards 24. As shown in FIG. 5, the circuit paths 42 extend substantially horizontally.

In summary, for the application described above, each of the secondary backplane boards 24 routes 2048 interconnections and the main backplane board 10 is only required to route 4096 interconnections (along with approximately 2000 adjunct control interconnections not described herein). Thus, each of the secondary backplane boards 24 can be manufactured with forty-two layers and the main backplane board 10 can be manufactured with forty-six layers, well within current manufacturing capability.

While the foregoing discussion has used the directional terms "vertical" and "horizontal", it will be appreciated that these particular directional terms are for illustrative purposes only. What is contemplated by the present invention is that the cross-connection circuit paths are divided between the main backplane board and the secondary backplane boards, with the main backplane board having circuit paths substantially in a first direction aligned with the circuit cards and the secondary backplane boards having circuit paths substantially in a second direction at a right angle to the first direction (i.e., across all the circuit cards).

Accordingly, there has been disclosed an improved high density cross-connection system. While an illustrative embodiment of the present invention has been disclosed herein, it is understood that various adaptations and modifications to the disclosed embodiment are possible and it is intended that this invention be limited only by the scope of the appended claims.

What is claimed is:

1. A cross-connection system for connecting a first plurality of circuit terminations at connectors on each of a second plurality of circuit cards to transmission media terminations at each of a third plurality of cable connectors, so that the total number of connections to be made by the cross-connection system is equal to said first plurality times said second plurality times said third plurality, the cross-connection system comprising:
   a main backplane board having a first side and a second side;
   a plurality of card connectors on said first side of said main backplane board adapted for mating engagement with respective connectors of said plurality of circuit cards;
   a plurality of secondary connectors on said second side of said main backplane board and arranged in a plurality of groups;
   a plurality of secondary backplane boards each corresponding to a respective one of said plurality of secondary connector groups and each having a first side and a second side;
   a plurality of connectors on said first side of each of said secondary backplane boards and adapted for mating engagement with the respective group of secondary connectors; and
   a plurality of connectors on said second side of each of said secondary backplane boards and adapted for mating engagement with respective ones of said cable connectors;
   wherein the main backplane board includes a plurality of circuit paths connecting the card connectors with the secondary connectors; and
   wherein each of the secondary backplane boards includes a plurality of circuit paths connecting the connectors on the first side of said each secondary backplane board with the connectors on the second side of said each secondary backplane board.

2. The cross-connection system according to claim 1 wherein:
   said plurality of card connectors are arranged to hold said plurality of circuit cards in a parallel spaced array;
   the plurality of circuit paths in the main backplane board extend substantially in a first direction each substantially parallel to, and within a region associated with, a respective one of said circuit cards; and
   the plurality of circuit paths in each of the secondary backplane boards extend substantially orthogonal to said first direction.

3. The cross-connection system according to claim 2 wherein:
   there are three groups of said secondary connectors and three secondary backplane boards;
   each of said plurality of card connectors has three portions each corresponding to a respective one of said secondary backplane boards, said three portions including a central portion and two outer portions with said two outer portions flanking said central portion in said first direction;
   each secondary connector in a first group of said secondary connectors is across said main backplane board from a first outer portion of a respective card connector;
   each secondary connector in a second group of said secondary connectors is across said main backplane board from a second outer portion of a respective card connector;
   each secondary connector in a third group of said secondary connectors is on the other side of each secondary connector in the second group from each secondary connector in the first group in said first direction; and
   the plurality of circuit paths in the main backplane board connect the central portion of a respective card connector with a respective secondary connector in the third group.

4. A cross-connection system including a main backplane board and a plurality of circuit cards mountable to a first side of said main backplane board in a spaced parallel array, wherein the improvement comprises:
   at least one secondary backplane board secured to a second side of said main backplane board and parallel to said main backplane board;
   wherein said main backplane board includes a plurality of circuit paths substantially in a first direction aligned with said plurality of circuit cards and said at least one secondary backplane board includes a plurality of circuit paths substantially in a second direction at a right angle to said first direction.

* * * * *